United States Patent [19]

Banks

[11] Patent Number: 5,238,554
[45] Date of Patent: Aug. 24, 1993

[54] METHOD OF MAKING PATTERNS

[75] Inventor: Christopher P. Banks, Saffron Walden, England

[73] Assignee: Ciba-Geigy Corporation, Ardsley, N.Y.

[21] Appl. No.: 902,194

[22] Filed: Jun. 22, 1992

[30] Foreign Application Priority Data

Jun. 29, 1991 [GB] United Kingdom ................ 9114098

[51] Int. Cl.$^5$ .......................... C25D 5/48; C25D 9/02
[52] U.S. Cl. .................................. 205/125; 205/317; 156/659.1; 156/904
[58] Field of Search .............................. 205/125, 317; 156/659.1, 904

[56] References Cited

U.S. PATENT DOCUMENTS

| | | | |
|---|---|---|---|
| 4,746,399 | 5/1988 | Demmer et al. | 156/656 |
| 4,861,438 | 8/1989 | Banks | 205/125 |

FOREIGN PATENT DOCUMENTS 293312  3/1969  U.S.S.R. .

Primary Examiner—T. M. Tufariello
Attorney, Agent, or Firm—William A. Teoli, Jr.

[57] ABSTRACT

A method of making a metallic pattern on a substrate having a surface comprising bare metal in predetermined areas and metal coated with a resist in remaining areas which comprises (i) protecting the bare metal by electrodepositing thereon a heat-curable polymeric film having
   (a) a group which is reactive with an isocyanate group and
   (b) a blocked isocyanate group, and incorporating in the electrodeposited film a compound containing at least two groups selected from hydroxy, amino and carboxyl,
(ii) heating the electrodeposited film to render it resistant to a solvent with which the resist is removable
(iii) removing the resist from said remaining areas using a solvent which does not remove the electrodeposited polymeric film, thereby exposing metal in said remaining areas, and
(iv) etching the metal exposed in step (iii) using an etchant which does not remove the electrodeposited polymeric film, thereby leaving a metallic pattern protected by the electrodeposited polymeric film.

10 Claims, No Drawings

METHOD OF MAKING PATTERNS

The present invention relates to a method of making metallic patterns such as printed circuits and the like.

There are numerous methods used for the manufacture of printed circuit boards, although some of the steps used are common to the various methods.

In the case of single sided printed circuit boards, the board, comprising a copper clad base laminate, has holes drilled where desired, a resist is coated on the copper in a predetermined pattern, using screen printing or photoimaging techniques, to give a board having bare copper in some areas and copper coated by the resist in remaining areas, the bare copper is then plated with a tin-lead alloy, the resist is then removed, the copper thereby exposed is etched using an etchant which does not remove the tin-lead alloy, which is finally removed using a tin-lead alloy stripper.

In the case of double sided, plated through hole printed circuit boards, the procedure is similar, but with the following additional steps: after the holes are drilled the board is subjected to electroless copper deposition to deposit copper on the surface of the holes (as well as over all the copper); and after applying the resist in a predetermined pattern the board is subjected to copper electroplating to deposit copper on the bare copper parts including the surface of the holes.

Disadvantages of these processes are the high cost of the tin-lead alloy stripper and the necessary subsequent cleaning; and the tin-lead stripper (usually a mixture of hydrogen peroxide and sulphuric acid) is aggressive to the boards themselves and to personnel and equipment used in carrying out the stripping.

It has been proposed in Russian Patent Specification No: 293312 to use an electrodeposited polymeric enamel to protect exposed copper during the manufacture of a printed circuit board. This enamel is cured for 20–30 minutes at temperatures above 150° C. which are undesirably high temperatures for a printed circuit board. Furthermore, after etching, the cured enamel has to be removed by treating the board in an alkaline solution at 70° to 80° C.: again these are severe conditions for a printed circuit board which can damage the base laminate. In U.S. Pat. No. 4,746,399 there is described a process in which the exposed copper is protected by an electrodeposited resin which is left uncured while the resist is removed and etching is effected. There remains a need for a process in which the electrodeposited resin has increased solvent resistance but can nevertheless be removed, after the etching step, under conditions which minimise the risk of damage to the base laminate.

U.S. Pat. No. 4,861,438 describes a method in which formation of the resist pattern can be protected by an electrodeposited resinous film which can be heated at temperatures of 150° C. or below to give a film which is resistant to solvents used to remove the resist and resistant to etchants but which, after the etching process, can be removed using mild conditions. The film can be removed completely before subsequent processing of the printed circuit board or left in place while a solder mask resist is formed in a predetermined pattern on the board, the film then being removed selectively from areas not covered by the solder mask resist.

U.S. Pat. No. 4,861,438 provides a method of making a metallic pattern on a substrate having a surface comprising bare metal in predetermined areas and metal coated by a resist in remaining areas which comprises (i) protecting the bare metal by electrodepositing thereon a heat-curable polymeric film having (a) a group which is reactive with an isocyanate group and (b) a blocked isocyanate group, (ii) heating the electrodeposited polymeric film, to render it resistant to a solvent with which the resist is removable, (iii) removing the resist from said remaining areas using a solvent which does not remove the electrodeposited polymeric film, thereby exposing metal in said remaining areas and (iv) etching the metal exposed in step (iii) using an etchant which does not remove the electrodeposited polymeric film, thereby leaving a metallic pattern protected by the electrodeposited polymeric film.

The process of that U.S. patent does give the electrodeposited resin improved solvent resistance yet it can easily be removed when required. However, the resulting pattern does not have edges as sharp as is desired in many cases, e.g. for printed circuit boards having fine lines of copper. The pattern has what is known as "ragged edge".

We have now found that if the electrodeposited resin of the process in U.S. Pat. No. 4,861,438 contains or is treated with a compound which reduces the de-blocking temperature of the blocked isocyanate, the temperature to which the film is heated can be reduced and the resulting pattern has sharper edges.

Accordingly the present invention provides a method of making a metallic pattern on a substrate having a surface comprising bare metal in predetermined areas and metal coated by a resist in remaining areas which comprises (i) protecting the bare metal by electrodepositing thereon a heat-curable polymeric film having (a) a group which is reactive with an isocyanate group and (b) a blocked isocyanate group, and incorporating in the electrodeposited film a compound containing at least two groups selected from hydroxy, amino and carboxyl (ii) heating the electrodeposited polymeric film, to render it resistant to a solvent with which the resist is removable (iii) removing the resist from said remaining areas using a solvent which does not remove the electrodeposited polymeric film, thereby exposing metal in said remaining areas and (iv) etching the metal exposed in step (iii) using an etchant which does not remove the electrodeposited polymeric film, thereby having a metallic pattern protected by the electrodeposited polymeric film.

The compound incorporated in the electrodeposited film may be a glycol or polyol, a polyamine, an amino alcohol, hydroxy acid, amino acid or polycarboxylic acid. Suitable compounds include glycine, sarcosine, ethanolamine, diethanolamine, hydroxy butyric acid, hydroxycaproic acid, lactic acid, fumaric acid, 1,2,3,4-butanetetracarboxylic acid, polyalkylene glycols such as polyethylene glycol having a molecular weight from a few hundred up to several thousand, preferably 20,000, polypropylene glycols, polyaminoamides, and amine adducts of glycidyl ethers.

In general polymeric compounds are preferred as they reduce the isocyanate deblocking temperature further and smaller amounts can be used, especially polyalkylene glycols.

The compound can be incorporated in the electrodeposited film during electrodeposition by adding it to the electrodeposition bath before the resin is deposited, or by dipping the electrodeposited film into a solution containing the compound before it is heated.

If the compound is added to the electrodeposition bath and is a salt forming compound, it must be one which will be deposited on the same electrode as the electrodepositable resin. Neutral or zwitterionic compounds will be carried down and deposited with the resin.

If the compound is added to the electrodeposition bath, it may be used in amounts of up to 10% of the total bath weight, preferably 1 to 4%.

If the compound is incorporated by a post electrodeposition dip, it may be present in aqueous solution at a concentration of up to 50% by weight preferably 10 to 20%. The electrodeposited resin may be dipped into the solution for a time of up to 15 minutes, preferably 2 to 5 minutes.

When carrying out the method of the present invention, the temperature needed in step (ii) is considerably lower than is needed in the absence of the compound containing hydroxy, amino and/or carboxyl groups. Usually the temperature may be reduced by about 20° C., and the resulting pattern has sharper edges.

The resist may be an epoxide resin applied by a screen printing process and then cured. Preferably, the resist is a photoresist cured in selected areas by applying it substantially uniformly to the substrate, which is usually a copper-clad laminate, subjecting it to actinic radiation in a predetermined pattern and then removing exposed or unexposed areas according to whether the photoresist is positive or negative respectively. Positive and negative photoresists for use in making printed circuit boards are well known materials and any of them may be used. They can be strippable under aqueous conditions or by means of an organic solvent. A further layer of metal, which can be another layer of copper or a layer of another metal such as nickel, may be deposited on bare copper areas before electrodeposition of the heat-curable polymeric film.

In the electrodeposited heat-curable film, the group reactive with an isocyanate group may be a hydroxyl group, a mercapto group, a primary or secondary amino group or a carboxyl group; preferably it is a hydroxyl group. The blocked isocyanate group may be an isocyanate group blocked in a known manner by reaction with an active hydrogen atom so that the resulting blocked group is unreactive at ambient temperatures but is reactive at elevated temperatures. In the present invention, the elevated temperature needed is lower than that needed in the absence of the hydroxy amino and/or carboxyl containing compound. Such an active hydrogen atom may be, for example, in an alcoholic or phenolic hydroxyl group, a mercaptan group, a primary or secondary amino group, an imidazole group, an oxime group, a triazole group, a pyrazole group or a lactam group. Preferably, the active hydrogen atom is an alcoholic or phenolic hydroxyl group, a mercapto group, a primary or secondary amino group or an oxime group, with an alcoholic or phenolic hydroxyl group or an oxime group being particularly preferred.

Any of the large number of electrodepositable resins having a group which is reactive with an isocyanate group may be used, including acrylic resins:aducts of epoxide resins with primary and secondary amines, polycarboxylic acids or their anhydrides, or aminocarboxylic, mercaptocarboxylic or aminosulphonic acids; and reaction products of phenolic hydroxyl group-containing resins with an aldehyde and an amine or amino- or mercapto-carboxylic or aminosulphonic acid. Suitable acrylic resins include copolymers of at least one acrylic ester such as an alkyl or hydroxyalkyl acrylate or methacrylate with an ethylenically unsaturated monomer containing a salt-forming group, such as an acrylic monomer containing a carboxylic or tertiary amino group and, optionally, another ethylenically unsaturated monomer. Suitable epoxide resin adducts include those of diglycidyl ethers of dihydric alcohols or bisphenols with a primary or secondary amine, usually a monoamine such as ethanolamine, 1-amino-2-propanol, diethanolamine or diethylamine, a polycarboxylic acid such as maleic or succinic anhydride, an aminocarboxylic acid such as o-, m- or p-aminobenzoic acid or a mercaptocarboxylic acid. Suitable reaction products of phenolic hydroxyl-containing resins include reaction products of phenol-terminated adducts of diglycidyl ethers with bisphenols, with aldehydes such as formaldehyde or benzaldehyde and amines such as ethanolamine, diethanolamine or ethylene diamine, aminocarboxylic acids such as glycine, sarcosine or aspartic acid, or mercaptocarboxylic acids such as thioglycolic or 3-mercaptopropanionic acid.

Preferred electrodepositable resins are copolymers of at least one monoacrylic ester, particularly selected from methyl acrylate, ethyl acrylate, 2-hydroxyethyl acrylate, 2-hydroxypropyl acrylate, butyl acrylate, ethylhexyl acrylate and the corresponding methacrylates, with at least one monoacrylic monomer containing a carboxylic or tertiary amino group, particularly acrylic acid, methacrylic acid or dimethylaminoethyl methacrylate and, optionally, with a further vinyl monomer such as styrene. Other preferred electrodepositable resins are adducts of a diglycidyl ether of a bisphenol, particularly, bisphenol A, which may have been advanced, with a monoamine, particularly diethanolamine.

Blocked isocyanates suitable for use in admixture with the electrodepositable resin may be those having, per average molecule, more than one group of formula

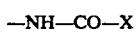   —NH—CO—X        I where X, preferred residues X and more preferred residues X are as hereinbefore described. Such blocked isocyanates can be prepared by reacting a material having, per average molecule, more than one isocyanate group, with a compound of formula

   XH        III where X is as hereinbefore defined, using the procedures for isocyanate —XH reactions hereinbefore described, to convert substantially all of the isocyanate content to —NHCOX. The material having an average more than one isocyanate group per molecule may be an isocyanate-terminated prepolymer derived from a polyol and a polyisocyanate; preferably it is a diisocyanate as hereinbefore described for use in the preparation of acrylic polymers containing a group of formula I, with tolylene-2, 4-diisocyanate being especially preferred.

In mixtures as hereinbefore described, the weight ratio of electrodepositable resin to blocked isocyanate is usually from 1:1 to 1000:1, preferably from 10:1 to 750:1, especially from 20:1 to 500:1.

Alternatively the electrodeposited heat-curable polymeric film may comprise a polymer having a group which is reactive with an isocyanate group, such as a hydroxy group and a blocked isocyanate group. Such a film is conveniently electrodeposited from a composition comprising an electrodepositable heat-curable polymer in an electrodeposition medium, said polymer having a group which is reactive with an isocyanate group, a blocked isocyanate group and a salt-forming group which is present at least partially in ionised form. Suitable such electrodepositable polymers include those obtained for example by reacting a hydroxyl- and salt forming group-containing polymer with a polyisocyanate to give a polymer containing hydroxyl, salt-forming and isocyanate groups, for example by using a polyisocyanate such as tolylene-2,4diisocyanate or isophorone diisocyanate which has at least one isocyanate group which is less reactive than the other isocyanate group or groups, and reacting the isocyanate content of the resulting polymer with a blocking agent, that is a compound containing an active hydrogen atom in, for example, a compound of formula XH as hereinbefore described. Alternatively, and preferably, the polyisocyanate is first reacted with the blocking agent to give an intermediate containing both free and blocked isocyanate groups and the free isocyanate content of the intermediate is reacted with for example, the hydroxy- and salt-forming group containing polymer. Suitable hydroxyl- and salt group-containing polymers include adducts of epoxide resins with amines or polycarboxylic, amino or mercapto acids; reaction products of phenolic hydroxyl group-containing resins with an aldehyde and an amine or an amino or mercapto acid; and copolymers of a hydroxyl group-containing vinyl monomer, e.g. a hydroxyl-containing acrylic monomer such as a hydroxyalkyl acrylate or hydroxyalkyl methacrylate, with a vinyl monomer containing a salt-forming group, e.g. an amine group-containing acrylic monomer such as a dialkylaminoalkyl acrylate or dialkyl-aminoalkyl methacrylate, optionally together with one or more other vinyl monomers. Especially preferred polymers of this type are copolymers of a hydroxyalkyl acrylate or methacrylate, a dialkylaminoalkyl acrylate or methacrylate, and one or more other monomers selected from alkyl acrylates, alkyl methacrylates and styrenes, modified by reaction with a reaction product of a tolylene diisocyanate and an especially preferred blocking agent of formula XH as hereinafter described.

The electrodepositable heat-curable salt-forming group-containing polymer may be neutralised, at least partially, before dissolution or dispersion in the electrodeposition medium to convert the salt-forming group, at least partially, into ionised form.

Preferably, however, this neutralisation is effected by the addition of a suitable acid or base to the electrodeposition medium. The salt-forming group is usually at least 10% neutralised, preferably 40 to 70% neutralised.

Where the salt-forming group is basic, electrodeposition in step (1) is preferably effected from a solution or dispersion in an aqueous medium together with an acid which at least partially neutralises the basic group. Where the salt-forming group is acidic, electrodeposition in step (i) is preferably effected from a solution or dispersion in an aqueous medium together with a base which at least partially neutralises the acidic group. When both acidic and basic groups are present, electrodeposition in stage (i) can be effected from a solution or dispersion in an aqueous medium together with an acid or base. The aqueous medium may contain a water-miscible organic solvent to assist dissolution or dispersion of the polymer and/or mixture. This solvent may be, for example, the solvent in which the blocked isocyanate-containing polymer or the hydroxyl-containing polymer is prepared. Suitable organic solvents include ketones such as acetone, methyl ethyl ketone and methyl isobutyl ketone, alochols such as ethanol, 2-methoxyethanol, 2-ethoxyethanol, 2-n-butoxyethanol, diethylene glycol monobutyl ether and dipropylene glycol monomethyl ether, and esters such as 2-methoxypropyl acetate and 2-ethoxyethyl acetate.

Accordingly, compositions suitable for carrying out the process of the invention as hereinbefore described comprise a solution or dispersion in an aqueous solvent of a mixture of (a) a polymer having a group which is reactive with an isocyanate group, a blocked isocyanate group and a salt-forming group, or a mixture of a polymer having a group which is reactive with an isocyanate group and a salt-forming group with a blocked isocyanate, as hereinbefore described, and (b) an acid or base which at least partially neutralises the salt-forming group. Conventional additives such as dyes, pigments, fillers, plasticisers and surfactants can be included in the composition. Generally the composition has a solids content of 2 to 40%, by weight.

Suitable acids for effecting neutralisation are organic and inorganic acids such as acetic, lactic, trichloroacetic, methanesulphonic, glycolic, p-toluenesulphonic, hydrochloric and sulphuric acids. Suitable bases for effecting neutralisation are organic and inorganic bases such as triethylamine, triethanolamine, pyridine, morpholine, sodium or potassium hydroxide, sodium or potassium carbonate or sodium or potassium ethoxide.

Electrodeposition of the heat-curable polymeric film may be carried out using conventional electrodeposition procedures for resinous materials. Voltages up to 200 volts for periods of up to 5 minutes are generally used, but the precise conditions for particular electrodeposited materials, substrates and desired thicknesses may be readily determined by those skilled in the art of electrodepositing resinous materials.

Voltages as low as 2 volts may be used in some cases, especially if the size of the electrode on which the polymeric film is deposited is small in relation to the other electrode. For example a cathodically depositable polymeric film may be deposited on a small cathode in a tank where the whole of the tank is the anode, at voltages of 2 volts or 5 volts.

The electrodeposited polymeric film is preferably dried, for example by heating at a temperature lower than that to be used for curing, before it is heated to render it resistant to the solvent to be used for removal of the resist. Heating in step (i) is generally effected to a temperature of 60° to 150° C., prefably 100° to 150° C.

An aqueous solvent may be used to remove the resist in step (iii). After the etching step (iv), at least part of the electrodeposited film may be removed using a solvent therefor. It is possible to use a combination of a resist and an electrodeposited polymeric film which are both strippable under acidic aqueous conditions or both strippable under basic aqueous conditions provided that the resist is strippable under milder conditions than are needed to remove the electrodeposited film, e.g. a more dilute solution of acid or base.

When an organic solvent is used to remove the resist in step (iii), a suitable solvent which does not dissolve the electrodeposited film can be found by routine experimentation. Both this solvent and the solvent used subsequently to remove the electrodeposited film can be selected from halohydrocarbons such as 1,1,1-trichloroethane and dichloromethane, hydroxylic solvents such as 2-n-butoxyethanol and 2-ethoxyethanol, esters such as 2-ethoxyethyl acetate, ketones such as acetone, methyl ethyl ketone and cyclohexanone and ethers such as tetrahydrofuran.

The temperature and duration of the heating required in step (ii) to render the electrodeposited film resistant to the solvent used in step (iii), but leave the film soluble in a solvent to be used to remove the film after the etching step (iv), can be readily determined by routine experimentation.

Preferably, the resist is removed in step (iii) using an aqueous solvent and at least part of the electrodeposited film is removed using an organic solvent, the resist and film being chosen accordingly.

In step (iv) of the process of the invention, the metal exposed by removal of the resist, usually copper, may be removed by any well known etchant such as ferric chloride, hydrogen peroxide/phosphoric acid, ammonium persulphate or cupric chloride.

At the end of step (iv), the substrate has a surface comprising predetermined areas of metal covered by the electrodeposited film and predetermined areas from which the metal has been removed by the etching process. Where the initial substrate is a copper-clad plastics laminate, at the end of step (iv) the surface comprises predetermined areas of copper covered by the electrodeposited polymeric film and areas in which the laminate base is devoid of copper.

After the etching, at least part of the electrodeposited polymeric film may be removed using a solvent therefor to leave bare copper areas for electrical connections. In one embodiment, a further resist to act, for example, as a solder mask is formed in a predetermined pattern over the electrodeposited film, thereby leaving areas of the electrodeposited film uncovered by the further resist, and said uncovered areas of the electrodeposited film are then removed. The pattern formation of the further resist can be effected by applying a photocurable resin composition directly in a predetermined pattern using a screen printing technique and irradiating the screen printed layer to effect cure thereof. Photocurable resin compositions which can be applied by screen printing are well known to those skilled in the art of making printed circuit boards. The photocurable resins can be, for example, resins containing polymerisable acrylate or methacrylate ester groups used together with free radical-generating photoinitiators therefor.

Preferably, the further resist is a photoresist which is applied in a layer over the electrodeposited film, irradiated in a predetermined pattern, thereby effecting a difference in solubility between exposed and unexposed parts thereof, and treated with a solvent to remove more soluble parts, this treatment with solvent also removing electrodeposited film underlying the more soluble parts of the irradiated photoresist.

Conventional positive and negative photoresists may be used as the further resist. They may be irradiated with actinic radiation in a predetermined pattern using known procedures.

Removal of more soluble areas of the irradiated photoresist and the parts of the electrodeposited film underlying those areas is effected by treatment with a solvent chosen according to the nature of the photoresist, and may be water, an aqueous (including aqueous organic) solution of an acid or base or an organic solvent or mixture of solvents. Suitable acid solutions include those of acetic, lactic, glycolic or toluene-p-sulphonic acids, while suitable basic solutions include those of sodium or potassium hydroxide or carbonate. Suitable organic solvents include hydrocarbons such as toluene and xylene, halohydrocarbons such as 1,1,1-trichloroethane and dichloromethane, hydroxylic solvents such as 2-ethoxyethyl acetate, ketones such as cyclohexanone, acetone and methyl ethyl ketone and ethers such as tetrahydrofuran. A suitable solvent can be found by routine experimentation.

When the photoresist used as the further resist is a negative photoresist, areas not exposed to radiation are removed by treatment with solvent. When a positive photoresist is used as the further resist, usually areas exposed to radiation are removed by treatment with solvent, although if an image reversal process is used, for instance with a quinone diazide photoresist, the areas initially exposed to radiation are subsequently rendered less soluble than the other areas so that the areas not exposed to radiation are removed by treatment with solvent.

In particularly preferred embodiments of the process of the invention when a further resist is applied, the first resist is removed by aqueous solvents, the more soluble parts of the irradiated further resist are removed by means of an organic solvent, and the electrodeposited film is removed by means of an organic solvent used to remove the further resist.

The process of the invention is very useful in the production of multilayer printed circuit boards, particularly those having plated through holes or vias.

The invention is illustrated by the following examples in which the resins and additives used are:

RESIN I

A monomer mixture consisting of styrene (47.5 parts), 2-ethylhexyl acrylate (25 parts), 2-hydroxyethyl methacrylate (20 parts) and 2-(dimethylamino)ethyl methacrylate (7.5 parts) with azobis(isobutyronitrile) (1.5 parts) is added dropwise over 2 hours to 2-n-butoxyethanol (50 parts) stirred under nitrogen at 100° C. The reaction mixture is maintained at 100° C. for a further 1 hour and a further charge of azobis(isobutyronitrile) (0.5 part) and 2-n-butoxyethanol (5.5 parts) is added. This procedure, namely heating at 100° C. for 1 hour then adding a further charge, is repeated twice more and the reaction mixture is held at 100° C. for a further hour and then cooled to ambient temperature. The amine value of the resulting copolymer solution is 0.28 eq/kg and the number average molecular weight of the copolymer is 12,900.

RESIN II

A mixture of butane-1,4-diglycidyl ether (25 parts), bisphenol A diglycidyl ether (25 parts) and tetramethylammonium chloride (0.17 part) is heated to 120° C. Bisphenol A (34 parts) is added over 10 minutes and the resultant mixture is heated at 150° C. for 2 hours by which time the epoxide content had fallen to 0.54 mol $kg^{-1}$. A mixture of diethanolamine (4.7 parts) and 2-butoxyethanol (20 parts) is then added. This mixture is reacted at 140° C. until the epoxide content is negligible. It is then cooled and diluted with 2-butoxyethanol (18 parts) to give Resin II.

RESIN III

A mixture of mixed cresols (324 parts), formalin (38.9%, 173.5 parts) and oxalic acid (3.8 parts) is heated at reflux for 6 hours. It is the stripped under reduced pressure to 180° C., holding at this temperature for 30 minutes. Whilst it is still hot, the resultant novolac is poured into an aluminium tray and allowed to solidify. This results in a novolac with a softening point of 126° C.

A mixture of the novolac prepared above (20 parts) and 2-butoxyethanol (40 parts) is heated at 60° C. A mixture of diethanolamine (3.15 parts), formalin (38.9%, 4.63 parts), lactic acid (4.3 parts) and 2-butoxyethanol (5 parts) is added and the resultant mixture is stirred at 80° C. for 6 hours. It is then cooled and added to aqueous sodium hydroxide solution. The resulting precipitate is collected, washed with water and dried at 60° C. under vacuum to give Resin III.

ADDITIVE I

This represents a 50% aqueous solution of a polyaminoamide designated ARALDITE HARDENER HZ340 of Ciba-Geigy Plastics.

ADDITIVE II

This represents a water-reducible amine adduct of a glycidyl ether (60% solids in 2-propoxyethanol) designated CMD J60-8290 of Interez Inc.

EXAMPLE 1

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin I (100 parts). A medium molecular weight trifunctional aliphatic blocked urethane crosslinker (TRIXENE SC796 from Baxenden Chemicals Ltd) (5.1 parts), 2-butoxyethanol (0.85 part), sarcosine (17 parts) and aqueous 20% lactic acid (6.7 parts) in water (470.35 parts). A voltage of 10 volts is applied for five minutes and the laminate is then removed from the bath and rinsed with water. The electrodeposited resin film coats the areas where there is no photoresist and the copper is exposed. The laminate is then baked at 90° C. for 10 minutes to introduce some crosslinking into the electrodeposited film. The laminate is then immersed in an aqueous 20% solution of HOECHST HB1160 DRY FILM STRIPPER at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

When the above is repeated in the absence of sarcosine, the minimum baking conditions are 110° C. for 10 minutes (preferably 120° C.).

EXAMPLE 2

Example 1 is repeated except that glycine (17 parts) is used instead of sarcosine and the bake is carried out at 100° C. for 10 minutes.

EXAMPLE 3

Example 1 is repeated except that PEG 12000 (17 parts) is used instead of sarcosine and the bake is carried out at 100° C. for 10 minutes.

EXAMPLE 4

A copper-clad laminate coated with RISTON 3415 aqueous developable photoresist, which has been imaged and developed to form a pattern in the photoresist, is used as the cathode in a electrodeposition bath equipped with a stainless steel anode and containing a solution of Resin (100 parts), TRIXENE SC796 (Baxenden Chemicals Ltd, 5.1 parts), 2-butoxyethanol (0.85 part), Additive I (4.2 parts) and aqueous 20% lactic acid (6.7 parts) in water (483.15 parts). A voltage of 10 volt is applied for five minutes and the laminate is then removed from the bath and rinsed with water. The electrodeposited resin film coats the areas where there is no photoresist and the copper is exposed. The laminate is then baked at 90° C. for 10 minutes to introduce some crosslinking into the electrodeposited film. The laminate is then immersed in an aqueous 20% solution of HOECHST HB1160 DRY FILM STRIPPER at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

When the above is repeated in the absence of Additive I, the minimum baking conditions are 110° C. for 10 minutes (preferable 120° C.).

EXAMPLE 5

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin I (100 parts), TRIXENE SC796 (Baxenden Chemicals Ltd., 5.1 parts), 2-butoxyethanol (0.85 parts), Additive II (3.5 parts) and aqueous 20% lactic acid (6.7 parts) in water (483.85 parts). A voltage of 10 volts is applied for five minutes and the laminate is then removed from the bath and rinsed with water. The electrodeposited resin film coats the areas where there is no photoresist and the copper is exposed. The laminate is then baked at 90° C. for 10 minutes to introduce some crosslinking into the electrodeposited film. The laminate is then immersed in an aqueous 20% solution of HOECHST HB1160 DRY FILM STRIPPER at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with electrodeposited film, on the laminate base. Immersion in a mixture of propylene carbonate (50 parts), gamma-butyolactone (20 parts) and butyl digol (30 parts) removes the electrodeposited film to leave a clear copper pattern on the laminate base.

When the above is repeated in the absence of Additive II, the minimum baking conditions are 110° C. for 10 minutes (preferably 120° C.).

EXAMPLE 6

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin I (100 parts), TRIXENE SC796 (Baxenden Chemicals Ltd., 5.1 parts), 2-butoxyethanol (0.85 part) and aqueous 20% lactic acid in water (487.35 parts). A voltage of 10 volts is applied for 5 minutes and the laminate is then removed from the bath and rinsed with water. The electrodeposited film coats the areas where there is no photoresist and the copper is exposed. The coated laminate is then dipped into an aqueous 10% PEG400 solution for 4 minutes. It is then removed from this bath and rinsed with water. The laminate is baked at 100° C. for 10 minutes to introduce some crosslinking into the electrodeposited film. The laminate is then immersed in an aqueous 20% solution of HOECHST HB1160 DRY FILM STRIPPER at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

When the above is repeated without the dip between the electrodeposition and the bake, the minimum baking conditions are 110° C. for 10 minutes (preferably 120° C.).

EXAMPLE 7

Example 1 is repeated except that PEG 35000 (17 parts) is used instead of sarcosine and the bake is carried out at 100° C. for 10 minutes.

EXAMPLE 8

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin II (100 parts), TRIXENE SC796 (Baxenden Chemical Ltd., 5.6 parts), 2-butoxyethanol (40.1 parts), PEG 12000 (18.6 parts) and aqueous 20% lactic acid (20.9 parts) in water (514.8 parts). A voltage of 60 volts is applied for 2 seconds and the laminate is then removed from the bath and rinsed with water. The electrodeposited film coats the areas where there is no photoresist and the copper is exposed. The laminate is then baked at 100° C. for 10 minutes to introduce some crosslinking into the electrodeposited film. The laminate is then immersed in an aqueous 10% solution of ROBERTSONS 279H DRY FILM STRIPPER at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

When the above is repeated in the absence of PEG 12000, the minimum baking conditions are 120° C. for 10 minutes.

EXAMPLE 9

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin III (100 parts), TRIXENE SC796 (Baxenden Chemicals Ltd., 8 parts), 2-butoxyethanol (100 parts), PEG 12000 (26.6 parts) and aqueous 20% lactic acid (51 parts) in water (714.4 parts). A voltage of 100 volts is applied for 1 second and the laminate is then removed from the bath and rinsed with water. The electrodeposited film coats the areas where there is no photoresist and the copper is exposed. The laminate is then baked at 110° C. for 10 minutes to introduce some crosslinking into the electrodeposited film. The laminate is then immersed in an aqueous 20% solution of HOECHST HB1160 DRY FILM STRIPPER at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

When the above is repeated in the absence of PEG 12000, the minimum baking conditions are 130° C. for 10 minutes.

I claim:

1. A method of making a metallic pattern on a substrate having a surface comprising bare metal in predetermined areas and metal coated with a resist in remaining areas which comprises
   (i) protecting the bare metal by electrodepositing thereon a heat-curable polymeric film having
      (a) a group which is reactive with an isocyanate group and
      (b) a blocked isocyanate group, and incorporating in the electrodeposited film a compound containing at least two groups selected from hydroxy, amino and carboxyl,
   (ii) heating the electrodeposited film to render it resistant to a solvent with which the resist is removable
   (iii) removing the resist from said remaining areas using a solvent which does not remove the electrodeposited polymeric film, thereby exposing metal in said remaining areas, and
   (iv) etching the metal exposed in step (iii) using an etchant which does not remove the electrodeposited polymeric film, thereby leaving a metallic pattern protected by the electrodeposited polymeric film.

2. A method as claimed in claim 1 in which the compound incorporated in the electrodeposited polymeric film is a glycol, a polyol, a polyamine, an amino alcohol, a hydroxy acid, an amino acid or a polycarboxylic acid.

3. A method as claimed in claim 2 in which the compound incorporated in the electrodeposited polymeric film is itself a polymeric compound.

4. A method as claimed in claim 3 in which the polymeric compound is a polyalkylene glycol.

5. A method as claimed in claim 1 in which the compound is incorporated into the polymeric film by adding it to the electrodeposition bath, before the resin is deposited, in amounts of up to 10% of the total bath weight.

6. A method as claimed in claim 1 in which the compound is incorporated in the electrodeposited film by dipping the film in an aqueous solution of said compound at a concentration of up to 50% by weight.

7. A method as claimed in claim 6 in which the film is dipped in said solution for a time of up to 15 minutes.

8. A method as claimed in claim 1 in which, in the electrodeposited heat-curable film, the group reactive with an isocyanate group is a hydroxyl, mercapto, primary or secondary amino, or carboxyl group.

9. A method as claimed in claim 1 in which the heat-curable film is formed by electrodepositing an electrodepositable resin containing a group reactive with an isocyanate group, and a salt forming group in admixture with a compound containing a blocked isocyanate group.

10. A method as claimed in claim 1 in which the heat-curable film is formed by electrodepositing an electrodepositable resin containing a group reactive with an isocyanate group, a salt-forming group and a blocked isocyanate group.

* * * * *